United States Patent [19]

Wan et al.

[11] Patent Number: 4,968,886

[45] Date of Patent: Nov. 6, 1990

[54] INFRARED DETECTOR AND METHOD

[75] Inventors: Chang-Feng Wan, Garland; Frank C. Sulzbach, Dallas, both of Tex.

[73] Assignee: Texas Instruments Incorporated, Dallas, Tex.

[21] Appl. No.: 400,603

[22] Filed: Aug. 30, 1989

[51] Int. Cl.$^5$ .............................. G01J 5/22; G01J 5/24
[52] U.S. Cl. ..................................... 250/332; 250/330; 250/338.3; 250/370.08
[58] Field of Search ................... 250/332, 330, 370.08, 250/338.3; 357/30 H, 61

[56] References Cited

U.S. PATENT DOCUMENTS

| | | |
|---|---|---|
| 3,989,946 | 11/1976 | Chapman et al. ................... 250/332 |
| 4,032,783 | 6/1977 | Koda ................................... 250/332 |
| 4,532,181 | 4/1983 | Brill et al. ........................... 428/338 |
| 4,684,812 | 8/1987 | Tew et al. ........................... 250/578 |
| 4,786,939 | 11/1988 | Haneda ................................. 355/4 |

Primary Examiner—Constantine Hannaher
Assistant Examiner—Jacob M. Eisenberg
Attorney, Agent, or Firm—James C. Kesterson; James T. Comfort; Melvin Sharp

[57] ABSTRACT

Materials for infrared transparent, electrically conductive applications such as gate for infrared detectors made of titanium oxynitride ($TiN_xO_y$), bismuth, and antimony. Titanium oxynitride with resistivity of at least 0.001 $\Omega$-cm provides sufficient transmittance for infrared detector gate application as illustrated in FIG. 4.

10 Claims, 5 Drawing Sheets

INFRARED DETECTOR AND METHOD

CROSS-REFERENCE TO RELATED APPLICATIONS

Copending U.S. application Ser. No. 769,993, filed 8/26/85, (Kinch and Simmons) discloses related subject matter. This cross-referenced application is assigned to the assignee of this application.

BACKGROUND OF THE INVENTION

1. Field of the Invention

The present invention relates to infrared radiation detectors and, more particularly, to small bandgap semiconductor infrared detectors and methods of fabrication.

2. Description of the Related Art

Detection of infrared radiation emitted by warm bodies provides an important method for night vision (perception without visible light). Infrared detectors are of various types and include small bandgap semiconductors structured as photodiodes or photocapacitors. Alloys of mercury telluride and cadmium telluride, generically denoted $Hg_{1-x}Cd_xTe$, are extensively employed as the photosensitive semiconductor in such detectors. Indeed, $Hg_{0.8}Cd_{0.2}Te$ has a bandgap of about 0.1 eV, and a 0.1 eV photon has a wavelength of 12 $\mu m$; whereas, $Hg_{0.73}Cd_{0.27}Te$ has a bandgap of about 0.24 eV, and a 0.24 eV photon has a wavelength of 5 $\mu m$. These two wavelengths are in the two atmospheric windows of greatest interest for infrared detectors.

An infrared imager incorporating an array of MIS photocapacitor detectors in $Hg_{1-x}Cd_xTe$ is disclosed in U.S. Pat. No. 4,684,812 (Tew and Lewis), hereby incorporated by reference. FIGS. 1a–b are cross sectional elevation and plan views of a single photocapacitor and illustrate the transparent nickel gate. There is a tradeoff between transmittance and electrical conductivity of the nickel gate, and typically the transmittance of 10 $\mu m$ wavelength photons is 50–60% with a sheet resistance of 100–200 $\Omega/\square$. Transmittance as high as 75% has been demonstrated but the nickel film becomes so thin (about 50 Å) that discontinuities begin to appear and manufacture becomes difficult. Further, manufacture of $Hg_{1-x}Cd_xTe$ containing devices requires processing temperatures below 200° C. to avoid decomposition of the $Hg_{1-x}Cd_xTe$, and this aggravates discontinuity problems. But the trend for infrared imagers is to a transmittance of at least 70%; and even thinner nickel gates will be called for.

Thus it is a problem of the known infrared transparent gates to simultaneously achieve high transmittance, high electrical conductivity, and manufacturability.

SUMMARY OF THE INVENTION

The present invention provides materials with high infrared transmittance for relatively thick films having moderate resistivity; preferred embodiments include bismuth, antimony and titanium oxynitride ($TiN_xO_y$). The invention also provides infrared detectors using these materials as gates for photocapacitors.

BRIEF DESCRIPTION OF THE DRAWINGS

The drawings are schematic for clarity.

DESCRIPTION OF THE PREFERRED EMBODIMENTS

Figure 1A:
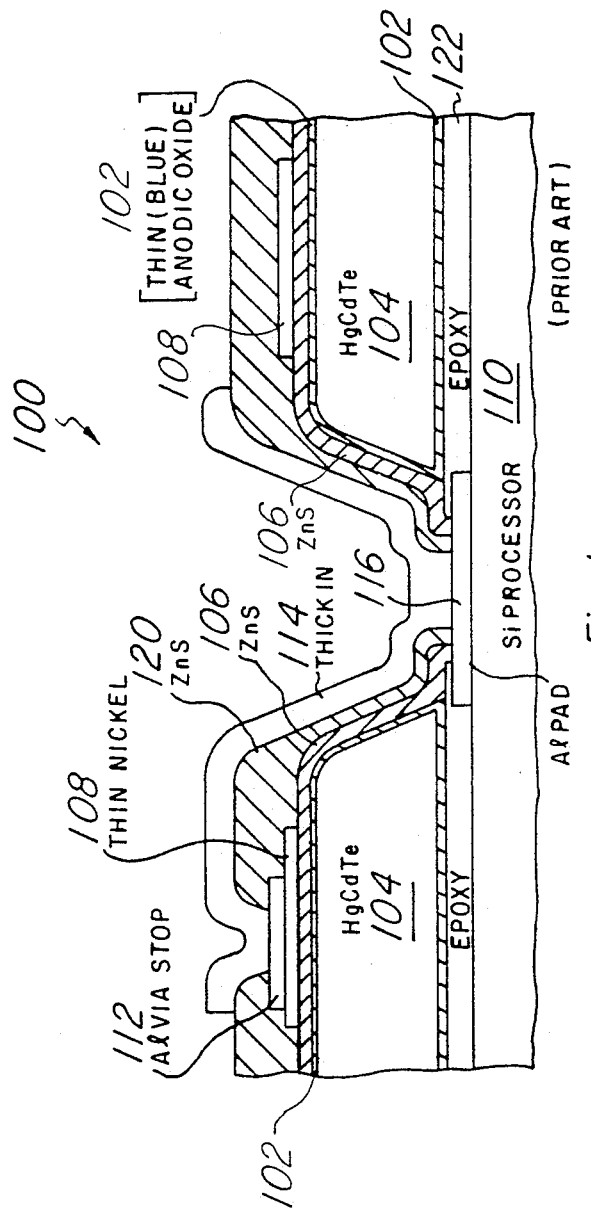
FIGS. 1a–b are cross sectional elevation and plan views of a prior art infrared photocapacitive detector.
Figure 1B:
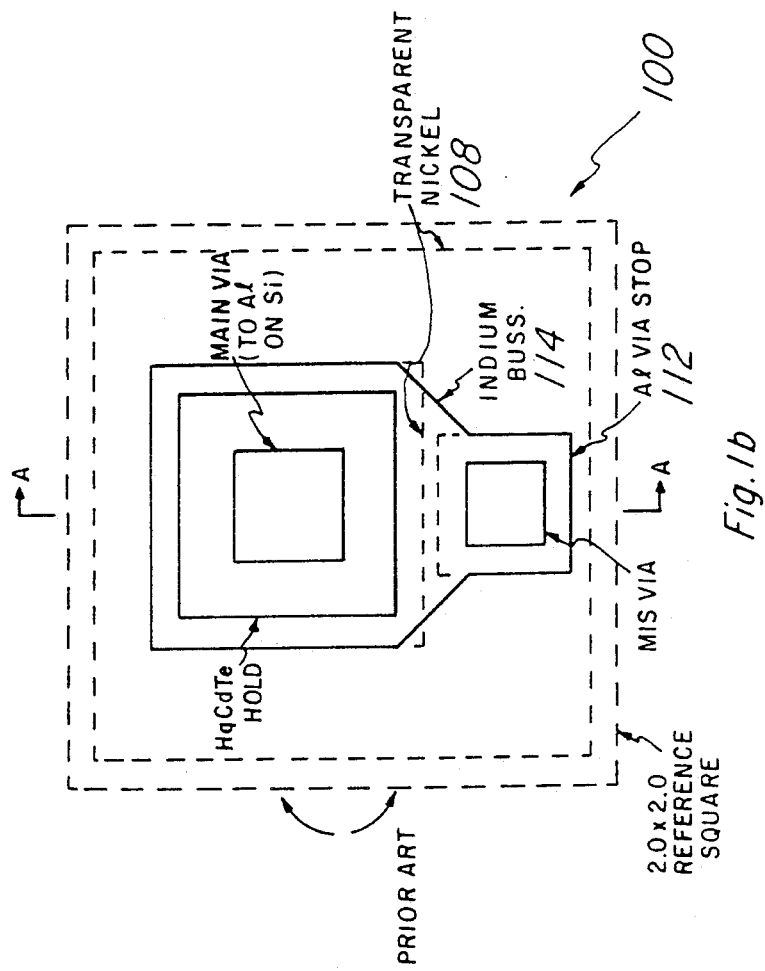

FIGS. 1a–b illustrate in cross sectional elevation and plan views a single pixel (denoted by reference numeral 100) of a prior art $Hg_{1-x}Cd_xTe$ photocapacitive infrared imager and show anodic oxide passivation 102 of $Hg_{1-x}Cd_xTe$ 104 together with ZnS gate dielectric 106 and nickel gate 108. FIG. 1a is a section taken along line a—a in FIG. 1b. The Figures also indicate the underlying silicon processor 110 for the imager, the metal connection (112-114-116) of gate 108 to silicon processor 110, ZnS insulation 120, and epoxy 122 affixing the $Hg_{1-x}Cd_xTe$ to the silicon processor. Nickel gate 108 is typically 70 Å thick and has a sheet resistance of about 100–200 $\Omega/\square$ and a transmittance of 50–60% for 10 $\mu m$ wavelength photons. In short, nickel has a relatively large extinction coefficient, and thus the gate must be quite thin.

As motivation for the preferred embodiment gate materials, consider transmittance of electromagnetic radiation through a material using the Drude model of a gas of electrons surrounding fixed positive cores. Maxwell's equations reduce to the wave equation with a complex dielectric constant dependent upon the radiation frequency:

$$\epsilon(\omega) = 1 + \frac{4\pi i \sigma}{\omega}$$

Here $\omega$ is the (radian) frequency and $\sigma$ is the complex conductivity of the material given by:

$$\sigma(\omega) = \frac{\sigma_o}{1 - i\omega\tau}, \quad \sigma_o = \frac{Ne^2\tau}{m}$$

where $\tau$ is the electron relaxation time (time between collisons), N is the number of electrons per volume, e is the electron charge, and m is the electron mass. For frequencies much greater than the electron collison probability per unit time (i.e., $\omega\tau >> 1$), the dielectric constant may be approximated as:

$$\epsilon(\omega) = 1 - \frac{\omega_p^2}{\omega^2}$$

with $\omega_p$ the plasma frequency given by:

$$\omega_p^2 = \frac{4\pi Ne^2}{m}$$

For $\omega > \omega_p$ the dielectric constant is then approximately real and positive, and electromagnetic waves may propagate in the material; whereas, for $\omega < \omega_p$ the dielectric constant is approximately real and negative, and electromagnetic waves exponentially decay in the material. In particular, the electromagnetic waves propagating in the x direction are of the form $$e^{i(\omega t + n \frac{\omega}{c} x) - k \frac{\omega}{c} x}$$

where $(n+ik)^2 = \epsilon$; n is the index of refraction and k is the attenuation or extinction coefficient. Thus for $\epsilon$ approximately real and positive, k is approximately zero and there is little attenuation; but for $\epsilon$ approximately real and negative, n is approximately zero and there is only exponential decay.

The alkalai metals have been observed to be tranparent to ultraviolet light, but opaque to visible light. Inserting typical values for N and $\tau$ for alkalai metals gives a plasma frequency of roughly $6 \times 10^{15}$/s which translates to a wavelength of about 0.3 $\mu$m, as observed. Thus to have a material that may be transparent in the infrared (wavelengths up to 12 $\mu$m), the plasma frequency should be a factor of 40 smaller than that of alkalai metals, and this implies N must be smaller by a factor of 1600. In other words, materials with conduction electron densities less than or on the order of $10^{19}$/cm$^3$ are candidates, and these include semimetals and semiconductors. Of course, low conduction electron densities implies high resistivity.

The first preferred embodiment material for an infrared transparent gate is bismuth (Bi). Bi is deposited by evaporation to a layer thickness of 500 Å; and gates are formed by photolithographic patterning and etching the Bi with a plasma of $CF_4/O_2$ or a wet etch of 0.5% bromine in methanol. The sheet resistance of the Bi layer is about 400 $\Omega/\square$ at 77° K. and the transmittance is about 85% at a 10 $\mu$m wavelength. The index of refraction plus extinction coefficient n+ik is about $8.2 - i\, 1.02$ for a 10 $\mu$m wavelength; this compares with nickel which has $n+ik = 5.8 - i23.3$. Thus Bi gates may be made much thicker than nickel gates for the same transmittance, and this eases manufacturing problems. In fact, the 500 Å Bi gate has about the same sheet resistance as a 60 Å nickel gate, but the nickel gate has a transmittance of only about 60% at a 10 $\mu$m wavelength.

Capacitance-voltage tests (at 100 KHz) of photocapacitors made with the 500 Å Bi gates on ZnS dielectric on passivated $Hg_{1-x}Cd_xTe$ show that the interface of Bi/ZnS is well behaved.

Also, antimony (Sb) is a semimetal like bismuth and may be used in place of bismuth. Antimony has a higher conduction electron density than bismuth (about $5 \times 10^{19}$ compared to $3 \times 10^{17}$), and thus larger free-carrier absorption.

The second preferred embodiment material for an infrared transparent gate is a version of titanium nitride (TiN). TiN is typically a good conductor when deposited by sputtering, evaporation, chemical vapor deposition (CVD), or plasma deposition; but this correlates with poor infrared transmittance. However, the preferred embodiment TiN has a significant portion of oxygen ($TiN_xO_y$) and a resistivity of at least 0.001 $\Omega$-cm at 77° K. This can provide a 500 Å-thick gate having a transmittance of 80% and a sheet resistance of about 400 $\Omega/\square$. The ratio of nitrogen to oxygen in the second preferred embodiment gate material is in the range of about one-to-two to two-to-one; that is, the compound is $TiN_xO_y$ with roughly $2 \geq x/y \geq 0.5$ (x-ray photoelectron spectroscopy indicates mixtures of compounds such as $TiN + TiNO + TiO + Ti_2O_3 + TiO_2$). As the oxygen content increases, the transmittance and resistivity both increase; however, sheet resistances on the order of 30,000 $\Omega/\square$ are too high for practical use due to problems such as excessive RC time constants and put a practical upper limit on the oxygen content. Contrarily, as the oxygen content decreases, the transmittance and resistivity both decrease, but transmittances lower than about 70% are insufficient.

Figure 2:
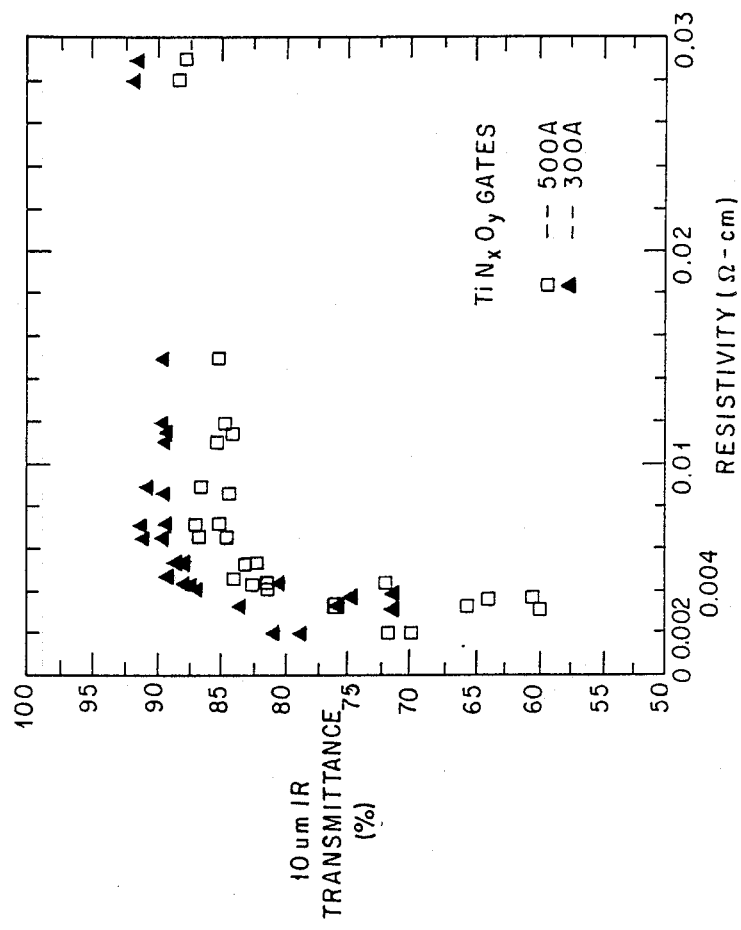
FIG. 2 shows transmittance as a function of resistivity for the second preferred embodiment.

FIG. 2 shows experimental results for effective 10 $\mu$m wavelength infrared transmittance of $TiN_xO_y$ gate detectors as a function of the bulk resistivity of the gate material. Detectors with gates of both 300 Å and 500 Å thickness were fabricated by evaporation and tested, and the thinner gates showed greater transmittance, as expected. For resistivities in the range of 0.002–0.004 $\Omega$-cm, some of the 500 Å thick gates had transmittances in the 60–65% range, but for resistivities over 0.004 $\Omega$-cm, all of the gates exceeded 70% transmittance. Note that a 500 Å thick gate with resistivity of 0.01 $\Omega$-cm has a sheet resistance of about 2,000 $\Omega/\square$. Convenient resistivities for use in 500 Å-thick gates would be in the range of 0.002 to 0.015, and with thicker gates or higher transmittance applications resistivities up to 0.05 $\Omega$-cm would be useful.

The bulk resistivity correlates with the oxygen content and thus FIG. 2 may also be considered an indication of transmittance as a function of oxygen content.

Figure 3:
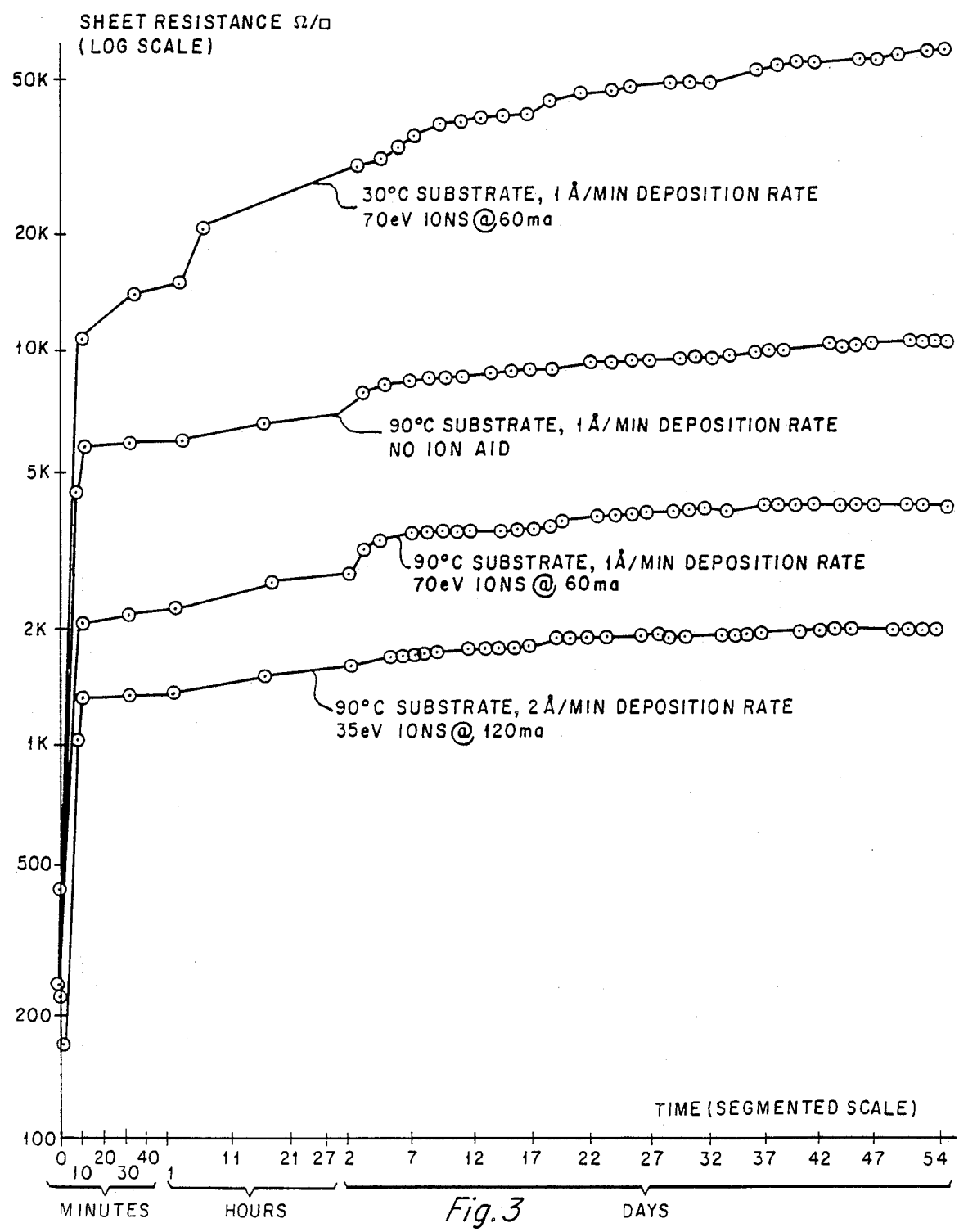
FIG. 3 shows sheet resistance during oxide conversion.

The second preferred embodiment $TiN_xO_y$ can be formed by electron beam evaporation of titanium in a nitrogen ambient. Essentially, $TiN_z$ is being formed, and subsequent exposure to air rapidly converts the $TiN_z$ to $TiN_xO_y$. FIG. 3 shows such a conversion process where $TiN_z$ films of thickness 875±125 Å were formed under different conditions and exposed to the ambient air and the sheet resistance was measured as a function of time. Time zero indicates the beginning of deposition chamber venting. Argon ion assisted deposition was also used, and film properties were controlled by nitrogen pressure, substrate temperature, deposition rate, ion energy, and ion beam current. The four films of FIG. 3 were all formed in a nitrogen atmosphere of 0.25 millitorr pressure but with differing substrate temperatures (30 and 90 degrees C.), differing deposition rates (1 Å/min and 2 Å/min), differing ion energy (70 eV, 35eV, and 0), and differing ion beam current (60 ma, 120 ma, and zero). The preferred sheet resistances for such thickness films would be in the range 1–10 K$\Omega/\square$ because this would give sufficient transmittance. The useful ranges for ion beam assistance would be ion energies of 10–100 eV and beam current densities of 50–150 $\mu$a/cm$^2$.

Figure 4:
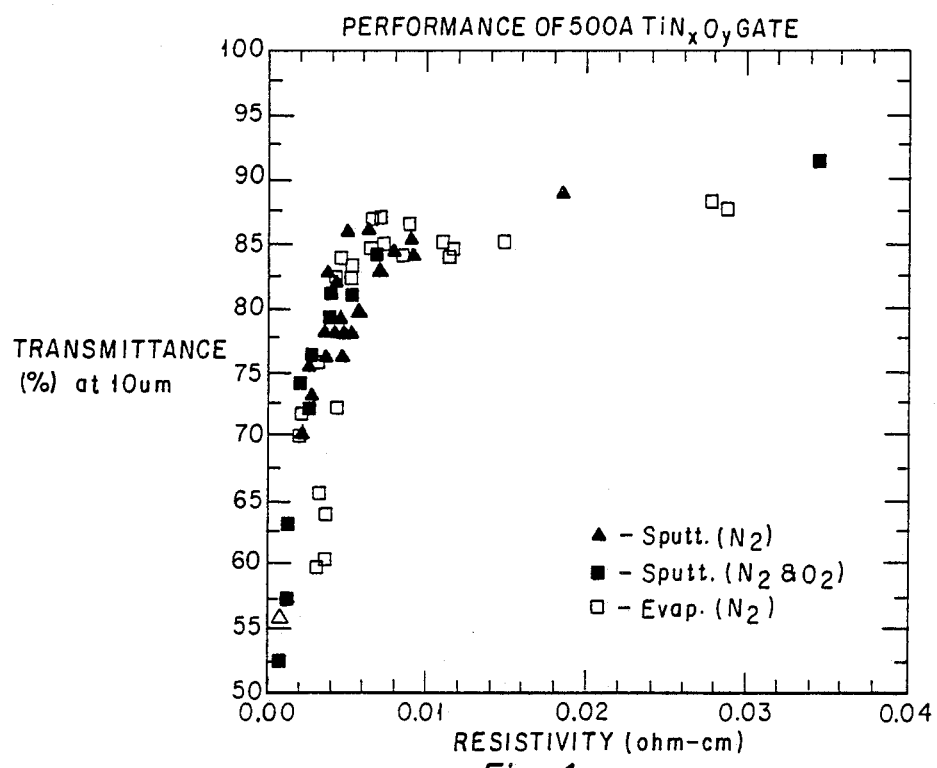
FIG. 4 show transmittance as a function of resistivity and of method of fabrication.
Figure 5:
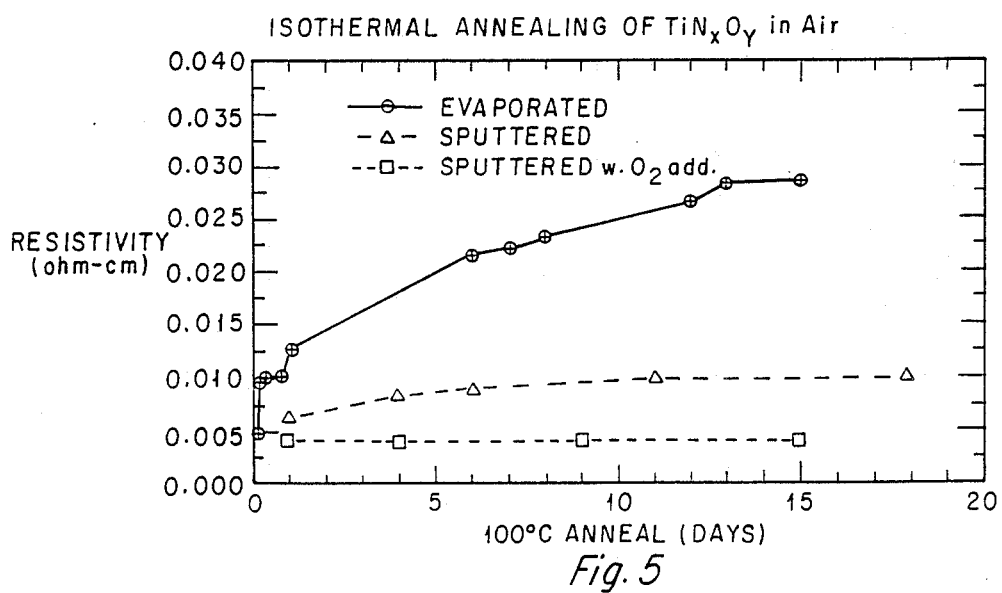
FIG. 5 illustrates air annealing effect on resistivity.

An alternative deposition technique involves the deposition of $TiN_xO_y$ by sputtering. Sputtering of TiN is known for use as a diffusion barrier in silicon and GaAs integrated circuits. The resultant resistivity and transmittance are very low, however. In order to achieve high infrared transmittance, the sputtering conditions are modified by either adding oxygen or adjusting pressure and power during sputtering, or both. It has been found that infrared transmittance increases if sputtering is performed with high nitrogen-to-argon ratios and/or low power. Transmission electron microscopy shows that voids are formed in the columnar structure of TiN during rective sputtering or evaporation, and oxygen or moisture can be readily absorbed along grain boundaries and throughout a film. This permits easy conversion to $TiN_xO_y$. FIG. 4 shows transmittance as a function of resistivity for three different methods of preparation of a 500 Å thick film of $TiN_xO_y$: (1) sputtering in nitrogen (solid triangles), (2) sputtering in nitrogen with oxygen added (solid squares), and (3) evaporation in nitrogen (open squares). In more detail, (1) sputtering of a titanium target in nitrogen plus argon yields a TiN-type film which is then converted to $TiN_xO_y$ by exposure to air. (2) Sputtering of a titanium target in nitrogen plus oxygen and argon directly yields a $TiN_xO_y$-type film, but the oxygen content may vary upon exposure to air and the rate of change of oxygen content will depend upon the sputtering conditions; see FIG. 5 which shows the effects of annealing in air at 100° C. the three different preparation methods. (3) Evaporation of titanium in a nitrogen atmosphere again yields TiN which is converted in air to $TiN_xO_y$. As shown in FIG. 4, the method of preparation is not crucial to the resistivity-transmittance relationship, and there is a knee in the relationship at about 0.005 $\Omega$-cm resistivity and 85% transmittance. Also, FIG. 4 suggests that for very low resistivities (e.g., 0.001 $\Omega$-cm), the preparation by sputtering may yield more reproducibly high transmittance. Note that the data of FIG. 2 are for preparation by evaporation in a nitrogen atmosphere, and that the open square data points are the same for FIGS. 2 and 4.

It has also been discovered that ion bombardment (such as during ion milling and sputtering with argon) can significantly reduce the resistivity of $TiN_xO_y$ films. Data suggests that a thin surface layer (10 to 30 Å) of TiN is formed, probably by the loss of oxygen. This provides a method of fabrication of gates with lower resistivity (and, consequently, lower transmittance) in applications where lower gate transmittance is preferably traded off for lower gate resistance, such as in CCDs (charge-coupled devices) which have long narrow gates crossing many charge transfer channels.

Also, the ion bombardment resistivity lowering permits formation of interconnections that are partially transparent, such as interconnection 114 in FIGS. 1a–b. Explicitly, a layer of $TiN_xO_y$ could be deposited in place of the indium 114 and photolithographically patterned and ion bombarded to form the interconnections.

$TiN_xO_y$ is resistant to etches such as bromine in methanol or a plasma of $CF_4/O_2$; but $TiN_xO_y$ may be etched by a chlorine-containing plasma, such as $BCl_3$.

MODIFICATIONS AND ADVANTAGES

Various modifications of the preferred embodiment devices and methods may be made while retaining the features of high infrared transmittance plus sufficient electrical conductivity.

For example, the dimensions and shapes of the detectors may be varied, the narrow bandgap semiconductor material may be HgCdZnTe, HgMnZnTeSe, or other II–VI semiconductors or epitaxial layers of such materials on substrates such as CdTe or GaAs, the narrow bandgap semiconductor may be of varying composition in order to detect two or more spectral bands of infrared radiation, the semiconductor may be a heterostructure, the gate insulator may be various dielectrics, including dopants to increase dielectric constant, and so forth. Films of the infrared transparent, electrically conductive material can be used in electrooptical devices or missile domes as well as infrared imager gates.

The invention provides the advantages of an infrared transparent, electrically conductive thin film prepared at relatively low temperatures.

What is claimed is:
1. An infrared imager, comprising:
 (a) a plurality of photocapacitive detectors, each of said detectors including:
  i. semiconductor material with a bandgap comparable to the energy of infrared photons;
  ii. an infrared transmissive, insulated gate on said semiconductor material, said gate made of a material selected from the group consisting of titanium oxynitride ($TiN_xO_y$); titanium oxynitride and bismuth; titanium oxynitride and antimony; and titanium oxynitride, antimony and bismuth.
2. The imager of claim 1, wherein:
 (a) the resistivity of said gate material is at least as great as 0.001 $\Omega$-cm.
3. The imager of claim 1, wherein:
 (a) the resistivity of said titanium oxynitride is in the range of 0.002 to 0.05 $\Omega$-cm.
4. The imager of claim 1, wherein:
 (a) $2 \geq x/y \geq 0.5$.
5. The imager of claim 1, wherein:
 (a) a single layer of gate material includes a plurality of said gates plus a plurality of interconnections for said gates, with said interconnections characterized by conversion of said gate material to higher conductivity.
6. A method of fabrication of transparent gates for infrared detectors, comprising the steps of:
 (a) providing an insulated narrow bandgap semiconductor layer;
 (b) forming a titanium oxynitride layer on said insulated semiconductor layer; and
 (c) defining gates from said titanium oxynitride.
7. The method of claim 6, wherein:
 (a) said forming is by sputtering titanium in a nitrogen containing atmosphere followed by converting said sputtered layer to titanium oxynitride by exposure to an oxygen-containing atmosphere.
8. The method of claim 6, wherein:
 (a) said forming includes sputtering titanium in a nitrogen plus oxygen containing atmosphere.
9. The method of claim 6, wherein:
 (a) said forming includes electron beam evaporation of titanium in a nitrogen containing atmosphere.
10. The method of claim 9, wherein:
 (a) said evaporation is aided by ion bombardment.

* * * * *